(12) United States Patent
Rajappan et al.

(10) Patent No.: US 9,680,475 B1
(45) Date of Patent: Jun. 13, 2017

(54) EARLY GLOBAL SET/RESET SIGNAL DETERMINATION FOR PROGRAMMABLE LOGIC DEVICES

(71) Applicant: Lattice Semiconductor Corporation, Portland, OR (US)

(72) Inventors: Venkatesan Rajappan, Fremont, CA (US); Sunil Sharma, Fremont, CA (US); Mohan Tandyala, San Jose, CA (US)

(73) Assignee: Lattice Semiconductor Corporation, Portland, OR (US)

( * ) Notice: Subject to any disclaimer, the term of this patent is extended or adjusted under 35 U.S.C. 154(b) by 0 days.

(21) Appl. No.: 15/073,583

(22) Filed: Mar. 17, 2016

(51) Int. Cl.
| | |
|---|---|
| *G06F 7/38* | (2006.01) |
| *H03K 19/173* | (2006.01) |
| *H03K 19/177* | (2006.01) |
| *G06F 17/50* | (2006.01) |

(52) U.S. Cl.
CPC ..... *H03K 19/1774* (2013.01); *G06F 17/5022* (2013.01)

(58) Field of Classification Search
CPC .................. H03K 19/1774; G06F 17/5022
USPC .............................. 326/38; 716/106, 104, 105
See application file for complete search history.

(56) References Cited

U.S. PATENT DOCUMENTS

| | | | | |
|---|---|---|---|---|
| 5,499,192 A | * | 3/1996 | Knapp ................ | G06F 17/5054 716/102 |
| 5,991,523 A | * | 11/1999 | Williams ............ | G06F 17/5022 703/15 |

OTHER PUBLICATIONS

Lattice Semiconductor Corporation, "How to Use the Global Set/Reset (GSR) Signal", FPGA How-To Topics, Jan. 19, 2009, pp. 1-20, Version 1.1 [online], [retrieved on Mar. 16, 2016]. Retrieved from the Internet: <URL:http://www.latticesemi.com/~/media/LatticeSemi/Documents/UserManuals/El/HowtouseGSRPURandTSALL.Pdf>.

\* cited by examiner

*Primary Examiner* — Daniel D Chang

(57) ABSTRACT

Techniques are provided to assign a set/reset signal of a user design to global set/reset (GSR) resources of a programmable logic device (PLD). By assigning a set/reset signal of the user design to the GSR resources during synthesis and prior to mapping, configurable resources consumed by the design may be reduced. In one example, a method includes receiving a user design for a programmable logic device (PLD) that comprises a plurality of configurable resources and global set/reset (GSR) resources. The method also includes identifying a plurality of set/reset signals of the user design. The method also includes determining, for each set/reset signal, a measurement of configurable resource savings associated with an assignment of the set/reset signal to the GSR resources. The method also includes assigning a selected one of the set/reset signals to the GSR resources based on the associated measurement. Additional methods and related systems are also provided.

17 Claims, 5 Drawing Sheets

EARLY GLOBAL SET/RESET SIGNAL DETERMINATION FOR PROGRAMMABLE LOGIC DEVICES

TECHNICAL FIELD

The present invention relates generally to programmable logic devices and, more particularly, to implementing global set/reset signals in such devices.

BACKGROUND

Programmable logic devices (PLDs) (e.g., field programmable gate arrays (FPGAs), complex programmable logic devices (CPLDs), field programmable systems on a chip (FPSCs), or other types of programmable devices) may be configured with various user designs to implement desired functionality. Typically, a user design undergoes a synthesis process in which the user functionality is converted to a logical representation (e.g., a netlist or register transfer level (RTL) description). The logical representation is then mapped to the types of resources available in the PLD (e.g., programmable logic gates, look-up tables (LUTs), embedded memories, embedded hardware, or other types of resources). Thereafter, the mapped design undergoes placement and routing in which it is specified in terms of the particular physical components and physical connections of the PLD. The resulting configuration data may then be loaded into PLD memory to configure the device.

For certain PLDs, some of the physical components may be hardwired to global set/reset (GSR) resources. By providing an appropriate signal to the GSR resources, large numbers of physical components of the PLD may be simultaneously set or reset. For example, such features may be used to reset the PLD to a desired state during testing and evaluation of a given user design.

In some cases, the GSR resources may be leveraged for use as part of the actual design implementation by providing a signal of the user design to the GSR resources. However, in most conventional approaches, signals are only assigned to the GSR resources during the mapping stage after the design has been synthesized into its logical components. As a result, such approaches cannot be used to reduce the overall number of logical components used to implement the user design. In some other approaches, the GSR resources may be used to a limited extent during synthesis by assigning a user signal to GSR resources based only on a fanout count of the user signal across the entirety of the design. Thus, conventional approaches to GSR resources provide little practical benefit for implementing real world designs in PLDs.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

In accordance with embodiments set forth herein, techniques are provided to assign a set/reset signal of a user design to global set/reset (GSR) resources of a programmable logic device (PLD). The GSR resources may include, for example, dedicated GSR inputs and associated GSR signal paths that are hardwired into the PLD. In this regard, the GSR signal paths may be physically connected to sequential components (e.g., flip-flops) of the PLD through associated GSR inputs. The individual sequential components may be selectively configured (e.g., by configuration data loaded into memory of the PLD) to be set or reset (e.g., configured with a first logic state or a second logic state) in response to a signal received through the GSR resources.

By assigning a set/reset signal of the user design to the GSR resources during synthesis and prior to mapping, configurable resources consumed by the design may be reduced. In this regard, logic and routing that may otherwise be used for the set/reset signal may be replaced by hardwired GSR resources that are already present in the PLD. Advantageously, by making this determination early during the synthesis stage, configurable resources that would otherwise be consumed by the user set/reset signal may be eliminated during synthesis and thus not carried through to the mapping stage.

In some embodiments, a plurality of user set/reset signals may be considered. The selection of a particular user set/reset signal may be based on, for example, the overall reduction in configurable resources that would result from assigning the selected user set/reset signal to the GSR resources, the fanout associated with the selected user set/reset signal, and/or other criteria as desired. In some embodiments, partitions (e.g., subsets) of the user design having different user set/reset signals may be separately analyzed during the synthesis stage to determine the particular selection that would provide the greatest overall reduction in configurable resources.

Although various signals are generally referred to herein as set/reset signals, it will be understood that such references are for purposes of illustration to encompass set signals (e.g., signals used to set an active logic state), reset signals (e.g., signals used to set an inactive logic state), and synchronous or asynchronous variations of each. Where desired, the techniques described herein may be separately applied to any of these types of signals as appropriate for particular embodiments.

Figure 1:
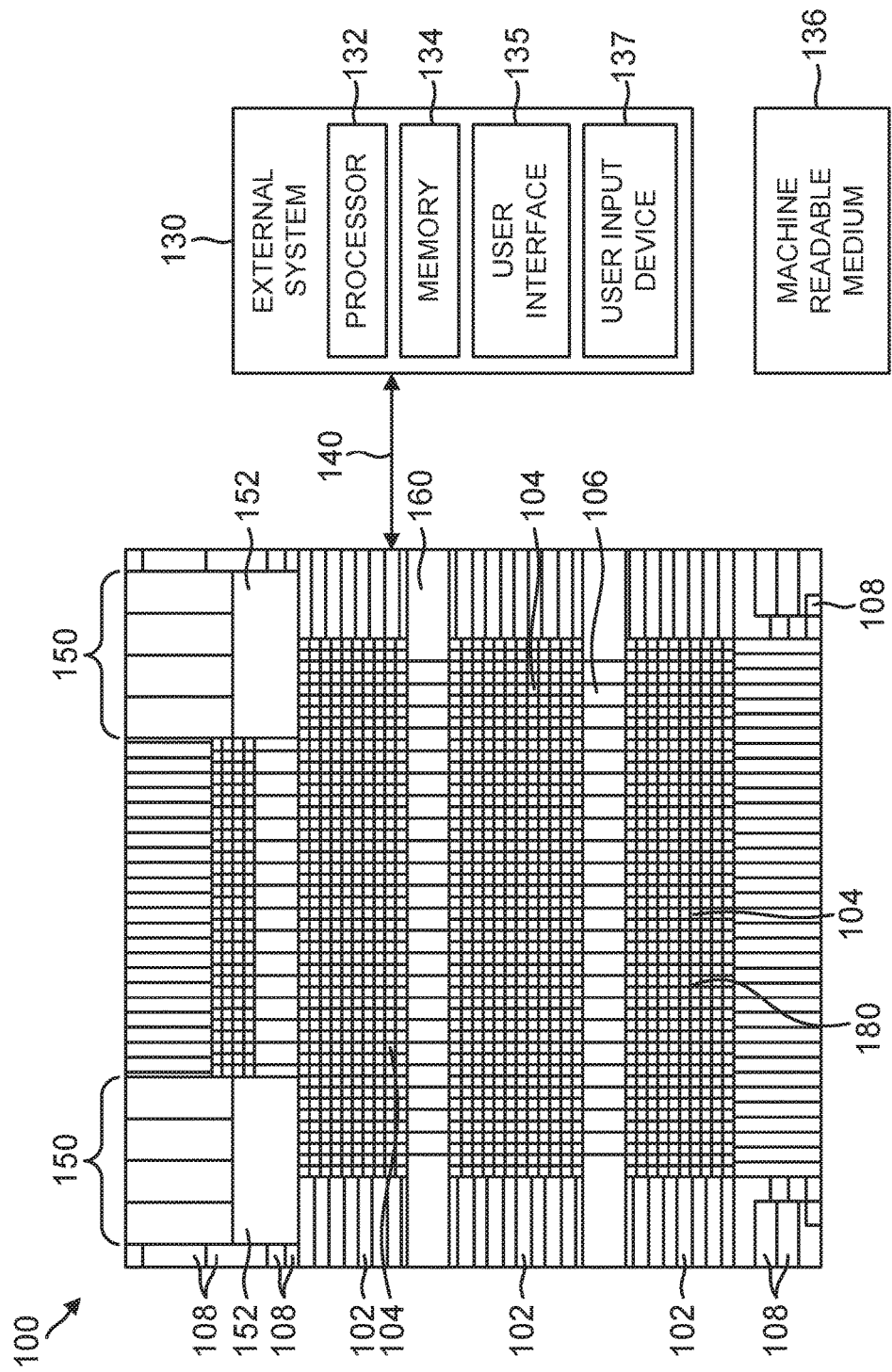
FIG. 1 illustrates a block diagram of a programmable logic device (PLD) in accordance with an embodiment of the disclosure.

Referring now to the drawings, FIG. 1 illustrates a block diagram of a PLD 100 in accordance with an embodiment of the disclosure. PLD 100 (e.g., a field programmable gate array (FPGA)), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)).

I/O blocks 102 provide I/O functionality (e.g., to support one or more I/O and/or memory interface standards) for PLD 100, while programmable logic blocks 104 provide logic functionality (e.g., look-up table (LUT) logic or logic gate array-based logic) for PLD 100. Additional I/O functionality may be provided by serializer/deserializer (SERDES) blocks 150 and physical coding sublayer (PCS) blocks 152. In various embodiments, I/O blocks 102 and SERDES blocks 150 may route signals to and from associated external ports (e.g., physical pins) of PLD 100. PLD 100 may also include hard intellectual property core (IP) blocks 160 to provide additional functionality (e.g., substantially predetermined functionality provided in hardware which may be configured with less programming than logic blocks 104).

PLD 100 may also include blocks of memory 106 (e.g., blocks of EEPROM, block SRAM, and/or flash memory), clock-related circuitry 108 (e.g., clock sources, PLL circuits, and/or DLL circuits), and/or various routing resources 180 (e.g., interconnect and appropriate switching logic to provide paths for routing signals throughout PLD 100, such as for clock signals, data signals, or others) as appropriate. In various embodiments, routing resources 180 may include user configurable routing resources and GSR routing resources (e.g., GSR hardwired signal paths). In general, the various elements of PLD 100 may be used to perform their intended functions for desired applications, as would be understood by one skilled in the art.

For example, I/O blocks 102 may be used for programming PLD 100, such as memory 106 or transferring information (e.g., various types of data and/or control signals) to/from PLD 100 through various external ports as would be understood by one skilled in the art. I/O blocks 102 may provide a first programming port (which may represent a central processing unit (CPU) port, a peripheral data port, an SPI interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). I/O blocks 102 typically, for example, may be included to receive configuration data and commands (e.g., over one or more connections 140) to configure PLD 100 for its intended use and to support serial or parallel device configuration and information transfer with SERDES blocks 150, PCS blocks 152, hard IP blocks 160, and/or logic blocks 104 as appropriate.

It should be understood that the number and placement of the various elements are not limiting and may depend upon the desired application. For example, various elements may not be required for a desired application or design specification (e.g., for the type of programmable device selected).

Furthermore, it should be understood that the elements are illustrated in block form for clarity and that various elements would typically be distributed throughout PLD 100, such as in and between logic blocks 104, hard IP blocks 160, and routing resources 180 to perform their conventional functions (e.g., storing configuration data that configures PLD 100 or providing interconnect structure within PLD 100). It should also be understood that the various embodiments disclosed herein are not limited to programmable logic devices, such as PLD 100, and may be applied to various other types of programmable devices, as would be understood by one skilled in the art.

An external system 130 (e.g., also referred to as an external device) may be used to create a desired user configuration or design of PLD 100, generate corresponding configuration data to program (e.g., configure) PLD 100, and test the operation of the configured PLD 100. For example, system 130 may provide such configuration data to one or more I/O blocks 102, SERDES blocks 150, and/or other portions of PLD 100. As a result, programmable logic blocks 104, routing resources 180, and any other appropriate components of PLD 100 may be configured to operate in accordance with user-specified applications.

In the illustrated embodiment, system 130 is implemented as a computer system. In this regard, system 130 includes, for example, one or more processors 132 which may be configured to execute instructions, such as software instructions, provided in one or more memories 134 and/or stored in non-transitory form in one or more non-transitory machine-readable mediums 136 (e.g., a memory or other appropriate storage medium internal or external to system 130). For example, in some embodiments, system 130 may run a PLD configuration application, such as Lattice Diamond System Planner software available from Lattice Semiconductor Corporation to permit a user to create a desired configuration and generate corresponding configuration data to program PLD 100.

System 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of PLD 100 and/or to identify various triggers used to evaluate the operation of PLD 100, as further described herein.

Figure 2:
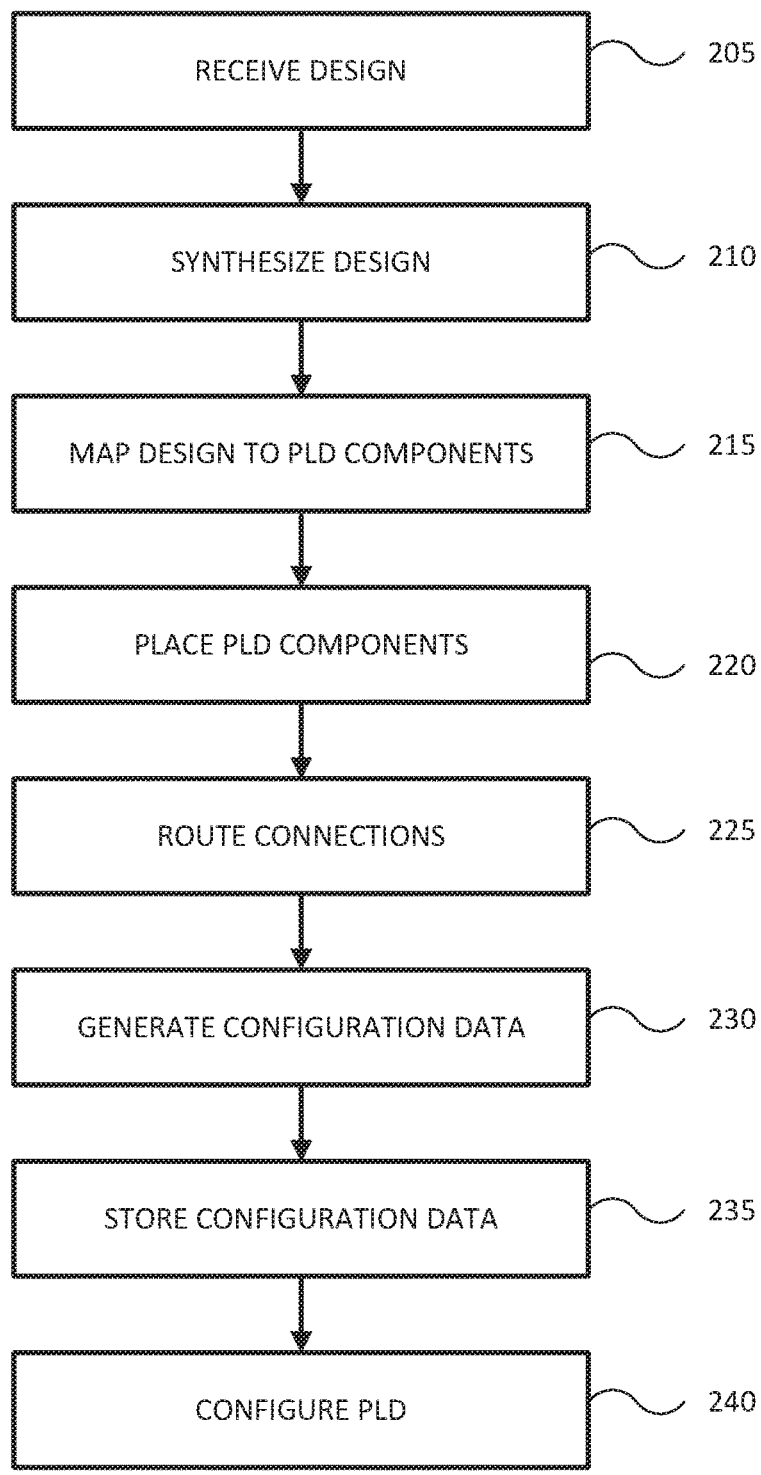
FIG. 2 illustrates a design process for a PLD in accordance with an embodiment of the disclosure.

FIG. 2 illustrates a design process for PLD 100 in accordance with an embodiment of the disclosure. For example, the process of FIG. 2 may be performed by system 130 running an appropriate configuration application as discussed. In some embodiments, the various files and information referenced in FIG. 2 may be stored, for example, in one or more databases and/or other data structures in memory 134, machine-readable medium 136, and/or otherwise.

In block 205, system 130 receives user design information that specifies the desired functionality of PLD 100. For example, the user may interact with system 130 (e.g., through user input device 137 and hardware description language (HDL) code representing the design) to identify various features of the user design (e.g., high level logic operations, hardware configurations, and/or other features). In some embodiments, the user design may be provided in a register transfer level (RTL) description (e.g., a gate level description). Also in block 205, system 130 may perform one or more rule checks to confirm that the user design describes a valid configuration of PLD 100. For example, system 130 may reject invalid configurations and/or request the user to provide a new user design as appropriate.

In block 210, system 130 synthesizes the overall design to be implemented by PLD 100 to create a netlist (e.g., a synthesized RTL description) identifying an abstract logic implementation of the overall PLD design. In some embodiments, the netlist may be stored according to a particular file format, such as Electronic Design Interchange Format (EDIF) in a Native Generic Database (NGD) file. As further discussed herein, the synthesis performed in block 210 may include analyzing one or more partitions of the user design to select and assign a user set/reset signal to the GSR resources of PLD 100.

In block 215, system 130 performs a mapping process that identifies components of PLD 100 that may be used to implement the PLD design. In this regard, system 130 may map the netlist to various types of components provided by PLD 100 (e.g., logic blocks 104, embedded hardware, and/or other portions of PLD 100) and their associated signals (e.g., in a logical fashion, but without yet specifying a placement or routing). In some embodiments, the mapping may be performed on one or more previously-stored files, with the mapping results stored as a physical design file (e.g., also referred to as an NCD file).

In block 220, system 130 performs a placement process to assign the mapped netlist components to particular physical components residing at specific physical locations of the PLD 100 (e.g., assigned to particular logic blocks 104 and/or other physical components of PLD 100), and thus determine a layout for the PLD 100.

In block 225, system 130 performs a routing process to route connections (e.g., using routing resources 180) among the components of PLD 100 based on the placement layout determined in block 220 to realize the physical interconnections among the placed components. Also in block 225, the user set/reset signal that was previously assigned to the GSR resources in block 210 is routed to the GSR resources.

Thus, following block 225, the user design will have been synthesized (e.g., converted and optimized), mapped, placed, and routed for PLD 100. In addition, the GSR resources of PLD 100 will have been used to help implement the user design by routing the identified user set/reset signal to one or more physical components of PLD 100. Accordingly, in block 230, system 130 generates configuration data for the completed user design.

In block 235, the configuration data is stored for subsequent use by PLD 100. For example, in some embodiments, the configuration data is stored in a non-volatile machine-readable memory (e.g., within PLD 100 itself or external to PLD 100 such as in machine-readable medium 136). When PLD 100 is started (e.g., powered on), the configuration data is loaded from the non-volatile memory into appropriate volatile memory of PLD 100 to configure PLD 100 for use. In other embodiments, the configuration data is stored by external system 130 and/or machine-readable medium 136 and loaded into appropriate volatile memory of PLD 100 when PLD is started.

In block 240, PLD 100 is configured and operated in accordance with the previously stored configuration data. As a result, PLD 100 may be operated in accordance with the final user design.

Figure 3:
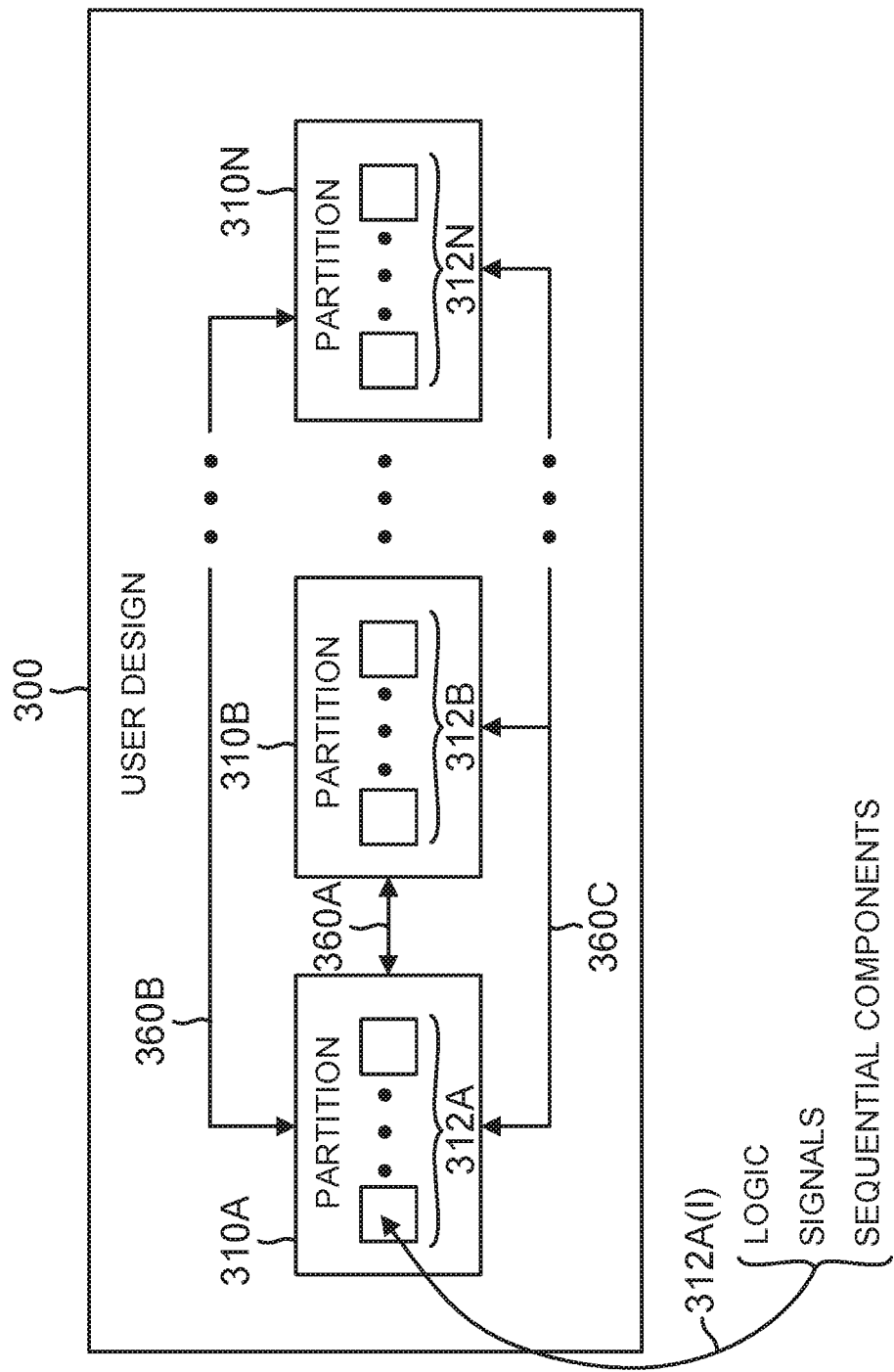
FIG. 3 illustrates a block diagram of a user design having a plurality of partitions in accordance with an embodiment of the disclosure.

FIG. 3 provides a representation of a user design 300 received in block 205 of FIG. 2 in accordance with an embodiment of the disclosure. In this regard, user design 300 includes a plurality of partitions 310A-N, each of which represents a subset of the overall design. For example, in some embodiments, user design 300 may be implemented in a modular fashion with each of partitions 310A-N provided by one or more different users, libraries, and/or other sources. Although particular partitions 310A-N are illustrated having particular types of associated features, any number of partitions and/or associated features may be provided.

As shown, each of partitions 310A-N may include a plurality of subgroups 312A-N including various signals and components. For example, as shown in FIG. 3, a particular subgroup 312A(1) of partition 310A includes various associated logic, one or more signals (e.g., control signals, data signals, clock signals, and/or other signals), and one or more sequential components. Similar signals and components may be provided in the various subgroups 312B-N of partitions 310B-N. As also shown, partitions 310A-N may be interconnected by one or more signals 360A-C to provide inter-partition communication.

Figure 4A:
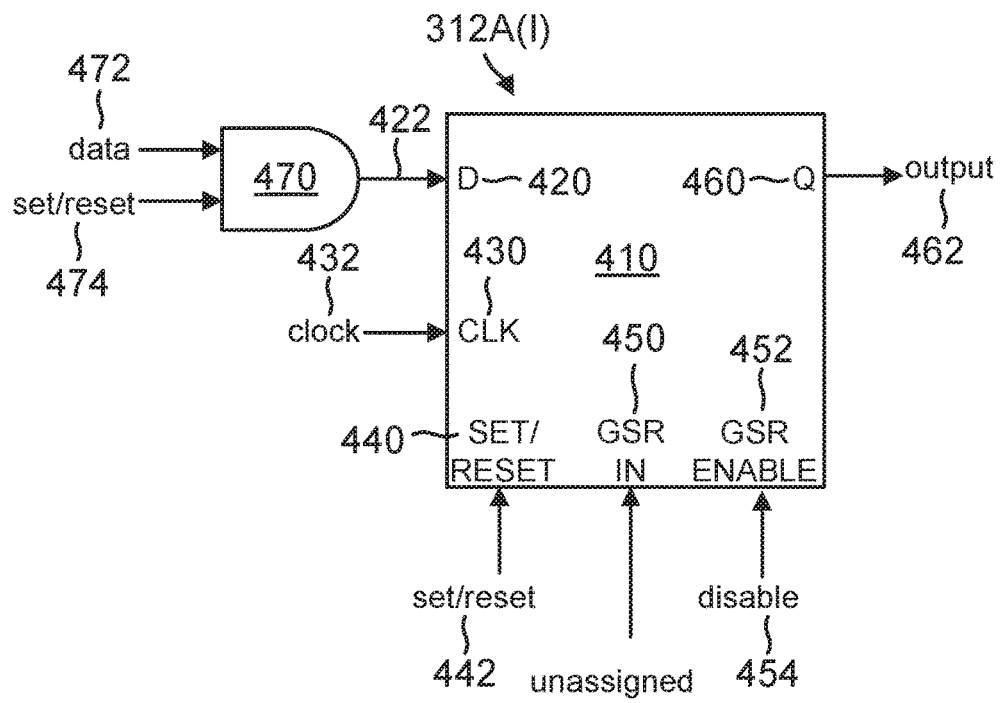
FIG. 4A illustrates a sequential component with additional logic and an unassigned global set reset (GSR) input in accordance with an embodiment of the disclosure.
Figure 4B:
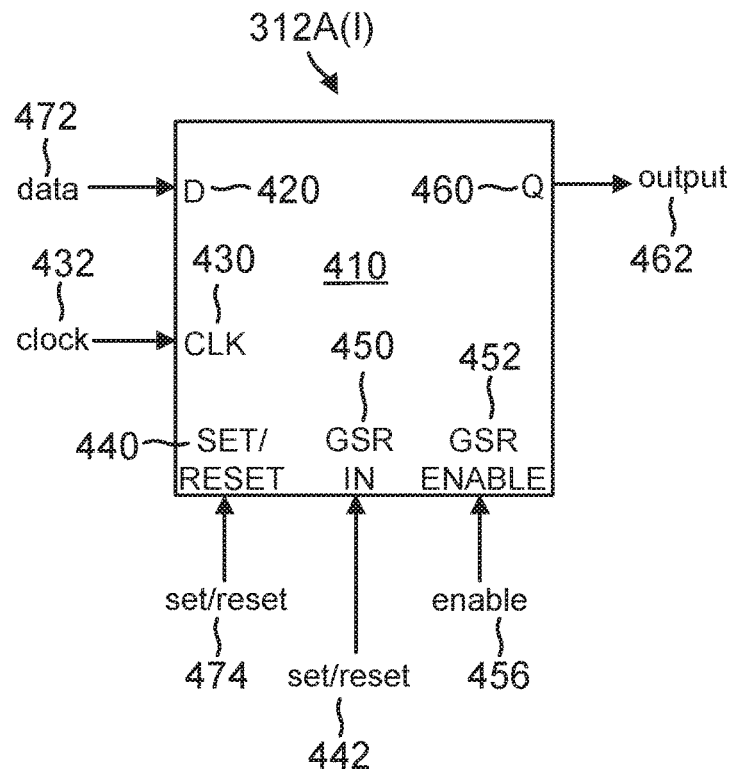
FIG. 4B illustrates the sequential component of FIG. 4A but without the additional logic and with an assigned GSR input in accordance with an embodiment of the disclosure.

As discussed with regard to block 210 of FIG. 2, a synthesis process may include analyzing one or more of partitions 310A-N of user design 300 to select and assign a set/reset signal of the user design to the GSR resources of PLD 100. FIGS. 4A-B illustrate examples of such a process. In this regard, FIG. 4A illustrates a particular subgroup 312A(1) of partition 310A prior to a GSR assignment in accordance with an embodiment of the disclosure. FIG. 4B illustrates the same subgroup 312A(1) of partition 310A after a GSR assignment in accordance with an embodiment of the disclosure. Although partition 310A and subgroup 312A(1) will be further discussed in the context of FIGS. 4A-B with regard to a certain set of components and signals, it will be understood that each of partitions 310A-N and each of subgroups 312A-N may be implemented with hundreds or even thousands of such components and signals in various embodiments, and the embodiments identified in FIGS. 4A-B are merely illustrative.

As shown in FIG. 4A, subgroup 312A(1) of partition 310A includes a sequential component 410, logic 470, and various signals as further discussed herein. Sequential component 410 (e.g., a flip-flop in this embodiment) includes a data input port 420 ("D"), a clock input port 430 ("CLK"), a set/reset input port 440 ("SET/RESET"), a GSR input port 450 ("GSR IN"), a GSR enable port 452 ("GSR ENABLE") and a data output port 460 ("Q"). Data input port 420 receives a data signal 422, clock input port 430 receives a clock signal 432, and set/reset input port 440 receives a set/reset signal 442 (e.g., an asynchronous set/reset signal in this embodiment). GSR input port 450 receives no signal in FIG. 4A and is therefore unassigned. GSR enable port 452 selectively enables or disables sequential component 410 to respond to set/reset signals received at GSR input port 450 (e.g., various components of PLD 100 may be selectively set/reset by the GSR resources). In FIG. 4A, GSR enable port 452 receives a disable signal 454 which causes sequential component 410 to ignore the GSR resources of PLD 100. Data output port 460 provides an output signal 462 corresponding to a logic value stored by sequential component 410.

Thus, as shown in FIG. 4A, all of the normally available input ports of sequential component 410 are assigned to various input signals, while GSR input port 450 remains unassigned, as this port is normally used for testing and evaluation of a user design, rather than the actual implementation of a user design. However, as also shown in FIG. 4A, the value of data input signal 422 is actually dependent on two other signals provided to logic 470 (e.g., an AND gate in this embodiment). Specifically, another data input signal 472 and another set/reset signal 474 (e.g., a synchronous set/reset signal in this embodiment) are received and processed by logic 470 to provide data input signal 422. In particular, data input signal 422 will correspond to data input signal 472 while set/reset signal 474 exhibits a logic high value. Data input signal 422 will be effectively reset to a logic low value while set/reset signal 474 exhibits a logic low value. In addition, sequential component 410 may be independently set or reset by set/reset signal 442 which is provided to set/reset input 440.

During a conventional synthesis process, logic 470 would normally be retained in user design 300 and therefore would be subsequently mapped, placed, and routed to be implemented by configurable resources of PLD 100 (e.g., one or more logic blocks 104 providing LUTs, gate logic, and/or other components). Thus, the implementation shown in FIG.

4A would result in configurable resources of PLD 100 being allocated to implement logic 470 and associated routing for data input signal 422, data input signal 472, and set/reset signal 474. If user design 300 includes additional instances of such logic and associated signals, then the overall allocation of configurable resources to such implementations can become significant.

However, as discussed, GSR input port 450 remains unassigned in the embodiment shown in FIG. 4A. As also discussed, GSR input port 450 is conventionally used for testing and evaluation of user design, and generally not for significant implementation of the user design. In accordance with embodiments discussed herein, subgroup 312A(1) may be analyzed during synthesis to identify one or more signals that may be provided to GSR input port 450 and related GSR signal paths in order to reduce the configurable resources of PLD 100 consumed by user design 300.

FIG. 4B illustrates the results of such analysis. As shown in FIG. 4B, set/reset signal 442 has been reassigned to GSR input port 450, set/reset signal 474 has been reassigned to set/reset input 440, data input signal 472 has been connected directly to data input port 420, and logic 470 has been removed. Advantageously, FIG. 4B retains the same operative functionality as FIG. 4A, but will utilize fewer configurable resources when ultimately implemented in PLD 100. In this regard, the logic value provided to data input port 420 will still correspond to data input signal 472 while set/reset signal 474 exhibits a logic high value. When set/reset signal 474 is activated (e.g., using an active low configuration in this embodiment), flip-flop 410 will be forced to store a logic low value. In addition, flip-flop 410 may still be independently set or reset by set/reset signal 442 which is now provided to GSR input port 450 (e.g., in embodiments where the GSR resources of PLD 100 operate asynchronously, an asynchronous implementation of set/reset signal 442 may be advantageously used to provide further compatibility). As also shown in FIG. 4B, GSR enable port 454 now receives a an enable signal 456 which causes sequential component 410 to respond to the signals received at GSR input port 450.

Thus, by assigning set/reset signal 442 to GSR resources of PLD 100 during synthesis, logic 470 can be eliminated. As a result, the design process of FIG. 2 will not need to map, place, or route configurable resources to implement logic 470. Further details of the synthesis process are provided by FIG. 5.

Figure 5:
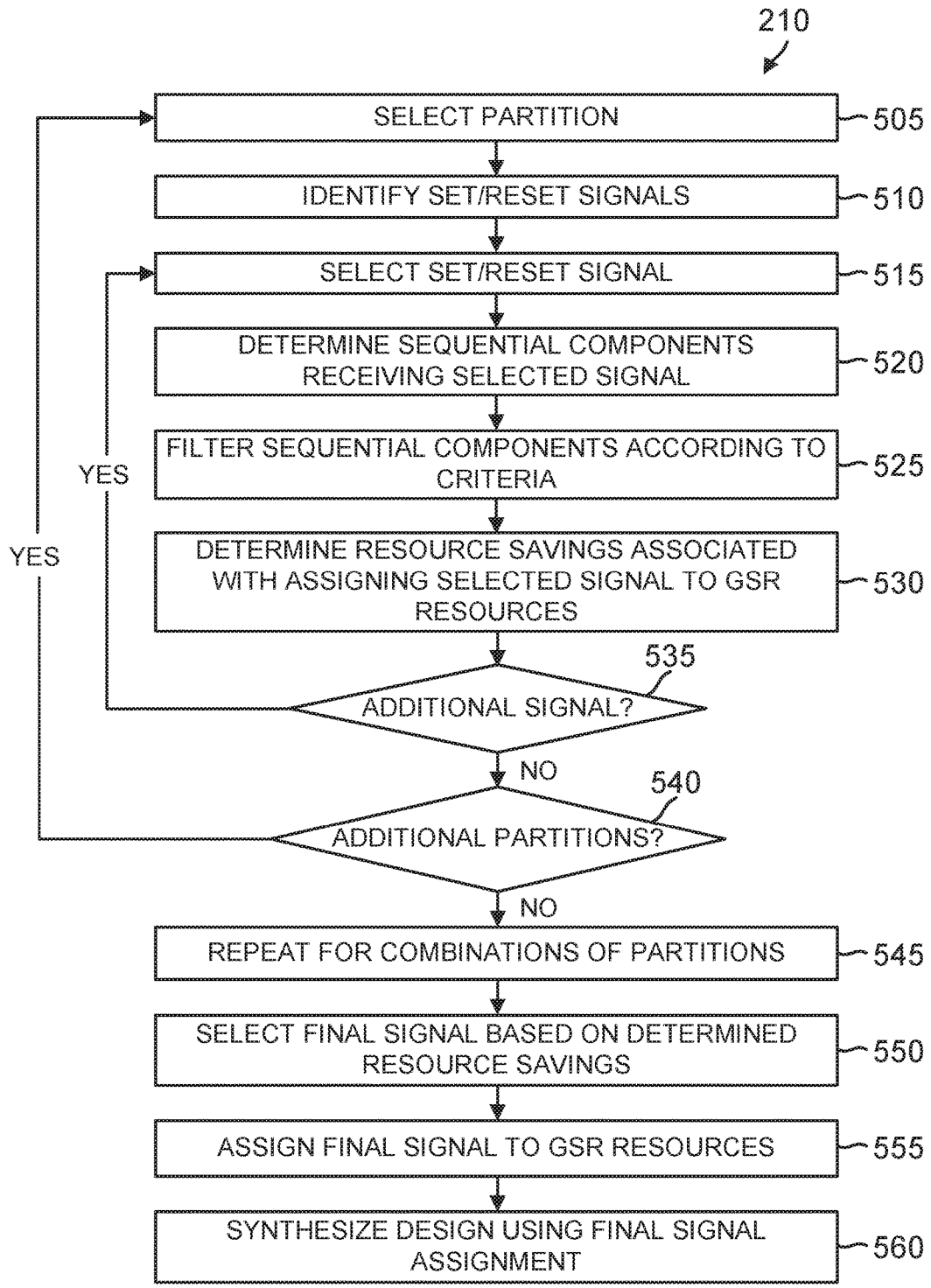
FIG. 5 illustrates a synthesis process for a PLD in accordance with an embodiment of the disclosure.

In this regard, FIG. 5 illustrates a synthesis process for PLD 100 which may be performed, for example, by system 130 on user design 300 during synthesis block 210 of FIG. 2 in accordance with an embodiment of the disclosure. In block 505, system 130 selects a partition of user design 300, such as partition 310A. As discussed, partition 310A may initially include a plurality of subgroups 312A, including the particular subgroup 312A(1) illustrated in FIG. 4A. As discussed, it will be understood that partition 310A and subgroup 312A(1) are merely representative for purposes of illustration, and that partition 310A and/or subgroup 312A(1) may include many additional components and signals in various embodiments.

In block 510, system 130 identifies the set/reset signals included in the selected partition 310A (e.g., any set/reset signals that are included among any of the subgroups 312A of partition 310A). In the example shown in FIG. 4A, system 130 may initially identify set/reset signals 442 and 474 (e.g., however, it is contemplated that many additional set/reset signals may be identified in other subgroups 312A of partition 310A).

In block 515, system 130 selects one of the set/reset signals identified in block 510. In the example shown in FIG. 4A, system 130 may select set/reset signal 442. Thereafter, in blocks 520 to 530, system 130 determines a measurement of configurable resource savings that would result from assigning the selected set/reset signal 442 to the GSR resources of PLD 100.

More specifically, in block 520, system 130 identifies any sequential components of partition 310A that receive the selected set/reset signal (e.g., directly through an input port or indirectly through other logic of the partition). In the example shown in FIG. 4A, system 130 may identify sequential component 410 because it receives the selected set/reset signal 442 (e.g., at set/reset input port 440). Additional sequential components of other subgroups 312A may also receive the selected set/reset signal 442 and may therefore also be identified during block 520 (e.g., many hundreds or thousands of possible sequential components of partition 310A may be identified).

In block 525, system 130 filters the identified sequential components in accordance with various criteria. For example, in one embodiment, system 130 may determine whether any of the identified sequential elements also receive another one of the set/reset signals previously identified in block 510 (e.g., system 130 may identify any of the sequential elements that receive at least two set/reset signals).

In the case of FIG. 4A, sequential element 410 receives the selected set/reset signal 442 (e.g., at set/reset input port 440) and further receives an additional set/reset signal 474 (e.g., through logic 470). As a result, sequential element 410 will have been identified using the filter criteria discussed above. Any additional sequential elements of partition 310A that also meet the criteria will also be identified.

In another embodiment, system 130 may use additional filter criteria in block 525, such as requiring that the at least two received set/reset signals be of the same set or reset type (e.g., requiring both signals to be set signals or reset signals to permit the signals to be interchanged with each other at set/reset inputs of the sequential components). In yet another embodiment, system 130 may use still other additional filter criteria in block 525, such as requiring that the at least two received set/reset signals be of different synchronization types (e.g., requiring one signal to be a synchronous set/reset signal that may be assigned to a synchronous set/reset input of a sequential component, and requiring one signal to be an asynchronous set/reset signal that may be assigned to an asynchronous set/reset input of the sequential component).

Thus, following block 525, system 130 will have identified a filtered set of sequential components across all subgroups 312A of partition 310A that currently receive at least two set/reset signals (e.g., directly through corresponding input ports of the sequential components or indirectly through other logic of partition 310A) and/or comply with other criteria as appropriate.

In block 530, system 130 determines the resource savings, if any, that may be achieved by assigning the selected set/reset signal to any of the GSR input ports of the identified sequential components (e.g., routing the selected set/reset signal to a GSR input port through associated GSR signal paths that are hardwired into the PLD).

For example, in the case of selected set/reset signal 442 and identified sequential component 410, system 130 may determine whether any configurable resource savings may be achieved by assigning set/reset signal 442 from set/reset input port 440 (as shown in FIG. 4A) to GSR input port 450 (as shown in FIG. 4B). As previously discussed and further illustrated in FIG. 4B, such assignment will indeed provide resource savings through the elimination of logic 470. In this regard, by providing performing the signal assignments shown in FIG. 4B, logic 470 will no longer need to be mapped, placed, and routed to be implemented by configurable resources of PLD 100. For example, if logic 470 would otherwise be implemented by a LUT in PLD 100, then this would correspond to a configurable resource savings of at least one LUT resulting from the assignment of set/reset signal 442 to GSR input port 450.

In many cases, additional sequential elements of other subgroups 312A of partition 310A may similarly benefit (e.g., the portion of user design 300 represented by FIG. 4A may be replicated many times among the various subgroups 312A of partition 310A). Thus, the overall configurable resource savings associated with the assignment of set/reset signal 442 to GSR resources would be the total savings across the entire partition 310A (e.g., by assigning set/reset signal 442 to appropriate GSR resources across all available sequential components identified in the filtering operation of block 525).

The measurement of resource savings associated with the proposed signal reassignment may be calculated in various ways such as: determining the total number of particular configurable resources saved (e.g., LUTs, logic blocks 104, and/or other resources), determining the total PLD area associated with the configurable resources saved, determining the number of sequential components associated with saved configurable resources, and/or other considerations as appropriate. Thus, following block 530, system 130 will have determined a measurement of configurable resource savings associated with assigning the selected set/reset signal to GSR resources of PLD 100.

In block 535, system 130 determines whether any additional set/reset signals of the selected partition 310A remain to be considered. In this regard, system 130 may repeat blocks 515 to 530 until all set/reset signals of partition 310A have been considered and an associated resource savings measurement has been determined for each set/reset signal. After system 130 has iterated through blocks 515 through 530 for all set/reset signals of the selected partition 310A, system 130 will have determined a measurement of configurable resource savings associated with each of the set/reset signals of partition 310A.

In block 540, system 130 determines whether any additional partitions remain to be considered. In this regard, system 130 may repeat blocks 510 to 530 for each of remaining partitions 310B-N until all set/reset signals of remaining partitions 310B-N have been considered and an associated resource savings measurement has been determined for each set/reset signal. After system 130 has iterated through blocks 510 through 530 for all set/reset signals of all partitions 310A-N of user design 300, system 130 will have determined a measurement of configurable resource savings associated with each of the set/reset signals of all individual partitions 310A-N.

As shown in FIG. 3, user design 300 may further include one or more signals 360A-C that are shared by more than one partition. For example, signals 360A pass between partitions 310A and 310B, signals 360B pass between partitions 310A and 310N, and signals 360C pass between partitions 310A, 310B, and 310N. Therefore, in block 545, system 130 may further repeat the operations of blocks 510 to 530 for one or more combinations of partitions to determine measurements of configurable resource savings associated with signals 360A-N that span across larger portions of user design 300. In this regard, the operations of block 545 may consider any desired combination of partitions 310A-N up to and including the entire user design 300 as a whole.

Thus, following block 545, system 130 will have determined a measurement of configurable resource savings associated with each of the set/reset signals of user design 300. Thereafter, in block 550, system 130 selects a final one of the set/reset signals having the largest associated measurement of configurable resource savings. In block 555, system 130 assigns the final selected set/resource signal to the GSR resources of PLD 100. For example, if set/reset signal 442 is selected as the final signal to be assigned to GSR resources, then user design 300 will be modified to include the signal assignments shown in FIG. 4B. In block 560, system 130 further synthesizes user design 300 in accordance with the final GSR signal assignment. For example, if set/reset signal 442 is selected as the final signal to be assigned to GSR resources, then user design 300 will be modified to eliminate logic 470 in accordance with the implementation shown in FIG. 4B.

Following block 560, system 130 continues the process of FIG. 2 where subsequent mapping, placement, routing, and other operations are performed. As a result, the final configuration of PLD 100 will reflect the resource savings resulting from using GSR resources to implement s selected set/reset signal of user design 300.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

What is claimed:
1. A method comprising:
receiving a user design for a programmable logic device (PLD), wherein the PLD comprises a plurality of configurable resources, global set/reset (GSR) resources, and a plurality of sequential components;
identifying a plurality of set/reset signals of the user design;

determining, for each set/reset signal, a measurement of configurable resource savings associated with an assignment of the set/reset signal to the GSR resources; and assigning a selected one of the set/reset signals to the GSR resources based on the associated measurement, wherein the user design identifies connections between the set/reset signals and the sequential components; and the determining a measurement comprises filtering the sequential components, and determining configurable resource savings associated with assigning the set/reset signal to the GSR resources connected to the filtered sequential components.

2. The method of claim 1, wherein the sequential component is a flip-flop.

3. A method of claim 1, comprising:

receiving a user design for a programmable logic device (PLD), wherein the PLD comprises a plurality of configurable resources, global set/reset (GSR) resources;

identifying a plurality of set/reset signals of the user design;

determining, for each set/reset signal, a measurement of configurable resource savings associated with an assignment of the set/reset signal to the GSR resources; and assigning a selected one of the set/reset signals to the GSR resources based on the associated measurement, wherein the user design identifies a non-sequential logic component implementable by the configurable resources of the PLD and further identifies a connection between the selected set/reset signal and the logic component, the assigning comprises reassigning the selected set/reset signal from the logic component to the GSR resources and the method further comprises removing the logic component from the user design.

4. The method of claim 1, wherein:

the user design comprises a plurality of partitions; and the identifying and determining are performed independently for each partition of the user design.

5. The method of claim 1, wherein the filtering comprises identifying the sequential components receiving at least two of the set/reset signals.

6. The method of claim 5, wherein the at least two set/reset signals comprise one synchronous set/reset signal and one asynchronous set/reset signal.

7. The method of claim 5, wherein the at least two set/reset signals are both set signals or both reset signals.

8. The method of claim 1, wherein:

the identifying, determining, and assigning are performed as part of a synthesis process to convert the user design to a synthesized design; and the method further comprises: mapping the synthesized design to a plurality of PLD component types, and assigning the mapped PLD component types to physical components of the PLD.

9. A system comprising:

a processor; and a memory configured to store a plurality of computer readable instructions which when executed by the processor are configured to cause the system to perform a method comprising:

receiving a user design for a programmable logic device (PLD), wherein the PLD comprises a plurality of configurable resources, global set/reset (GSR) resources and a plurality of sequential components, identifying a plurality of set/reset signals of the user design, determining, for each set/reset signal, a measurement of configurable resource savings associated with an assignment of the set/reset signal to the GSR resources, and assigning a selected one of the set/reset signals to the GSR resources based on the associated measurement, wherein the user design identifies connections between the set/reset signals and the sequential components; and the determining a measurement comprises filtering the sequential components, and determining configurable resource savings associated with assigning the set/reset signal to the GSR resources connected to the filtered sequential components.

10. The system of claim 9, wherein:

the PLD further comprises a sequential component connected to the GSR resources;

the user design identifies a connection between the selected set/reset signal and a data input port of the sequential component; and the assigning comprises reassigning the selected set/reset signal from the data input port to the GSR resources.

11. The system of claim 10, wherein the sequential component is a flip-flop.

12. The system of claim 9, wherein:

the user design identifies a non-sequential logic component implementable by the configurable resources of the PLD and further identifies a connection between the selected set/reset signal and the logic component;

the assigning comprises reassigning the selected set/reset signal from the logic component to the GSR resources; and the method further comprises removing the logic component from the user design.

13. The system of claim 9, wherein:

the user design comprises a plurality of partitions; and the identifying and determining are performed independently for each partition of the user design.

14. The system of claim 1, wherein the filtering comprises identifying the sequential components receiving at least two of the set/reset signals.

15. The system of claim 14, wherein the at least two set/reset signals comprise one synchronous set/reset signal and one asynchronous set/reset signal.

16. The system of claim 14, wherein the at least two set/reset signals are both set signals or both reset signals.

17. The system of claim 9, wherein the identifying, determining, and assigning are performed as part of a synthesis process to convert the user design to a synthesized design, and the method further comprises:

mapping the synthesized design to a plurality of PLD component types, and assigning the mapped PLD component types to physical components of the PLD.

* * * * *